(12) United States Patent
Ueda et al.

(10) Patent No.: US 7,002,204 B2
(45) Date of Patent: Feb. 21, 2006

(54) NON-VOLATILE SEMICONDUCTOR MEMORY AND PROCESS OF FABRICATING THE SAME

(75) Inventors: Naoki Ueda, Nara (JP); Yasuhiro Sugita, Tenri (JP); Yoshimitsu Yamauchi, Nabari (JP)

(73) Assignee: Sharp Kabushiki Kaisha, Osaka (JP)

( * ) Notice: Subject to any disclaimer, the term of this patent is extended or adjusted under 35 U.S.C. 154(b) by 50 days.

(21) Appl. No.: 10/315,222

(22) Filed: Dec. 10, 2002

(65) Prior Publication Data

US 2003/0124803 A1 Jul. 3, 2003

(30) Foreign Application Priority Data

Dec. 10, 2001 (JP) .............................. 2001-376027

(51) Int. Cl.
*H01L 29/788* (2006.01)
(52) U.S. Cl. .................................................. 257/316
(58) Field of Classification Search ........ 438/257–267; 257/316–324
See application file for complete search history.

(56) References Cited

U.S. PATENT DOCUMENTS

| 4,267,632 A | | 5/1981 | Shappir | |
| 5,151,375 A | * | 9/1992 | Kazerounian et al. | 438/262 |
| 6,570,214 B1 | * | 5/2003 | Wu | 257/315 |

FOREIGN PATENT DOCUMENTS

| JP | 1-130570 A | 5/1989 |
| JP | 6-181298 A | 6/1994 |

OTHER PUBLICATIONS

U.S. Appl. No. 10/315,095 filed Dec. 10, 2002 entitled "Non-Volatile Semiconductor Memory and Method of Operating the Same".
U.S. Appl. No. 10/314,021 filed Dec. 9, 2002 entitled "Non-Volatile Semiconductor Memory and Method of Operating the Same".
Kume et al; A 1.28m2 Contactless Memory Cell Technology for a 3V-Only 64Mbit EEPROM; IEDM 92, pp. 991-993, 1992.

* cited by examiner

*Primary Examiner*—Richard A. Booth
(74) *Attorney, Agent, or Firm*—Nixon & Vanderhye P.C.

(57) ABSTRACT

A non-volatile semiconductor memory including at least one first gate electrode as a floating gate on a semiconductor substrate with intervention of a first insulating film as a tunnel oxide film; sidewall spacers on both sidewalls of the first gate electrode in a direction of a channel length; a bit line formed of an impurity diffusion region of a conductivity type different from the conductivity type of the semiconductor substrate in a surface layer of the semiconductor substrate by the side of the first gate electrode, wherein the bit line comprises a first bit line formed in self-alignment using the first gate electrode as a mask and a second bit line formed in self-alignment using the first gate electrode and the sidewall spacers as a mask.

4 Claims, 14 Drawing Sheets

NON-VOLATILE SEMICONDUCTOR MEMORY AND PROCESS OF FABRICATING THE SAME

CROSS-REFERENCE TO RELATED APPLICATION

This application is related to Japanese Patent Application No. 2001-376027 filed on Dec. 10, 2001, whose priority is claimed under 35 USC § 119, the disclosure of which is incorporated by reference in its entirety.

BACKGROUND OF THE INVENTION

1. Field of the Invention

The present invention relates to a non-volatile semiconductor memory and a process of fabricating the same.

2. Description of Related Art

A variety of non-volatile semiconductor memories have been proposed, among which a typical one is disclosed by U.S. Pat. No. 4,267,632. This memory is illustrated in a schematic sectional view of FIG. 4(d).

In the non-volatile semiconductor memory shown in FIG. 4(d), a memory cell is comprised of a floating gate formed of a first polysilicon layer 13' and bit lines 17' located on both sides of the floating gate, and a plurality of memory cells of this structure are arranged in an array. One bit line 17' is shared by adjacent floating gates.

The fabrication of the above-mentioned related art non-volatile semiconductor memory is explained with reference to FIG. 4(a) to 4(d).

First, as shown in FIG. 4(a), an oxide film 12 is formed on a semiconductor substrate 11 of a first conductivity type, and a first polysilicon layer 13' is formed and patterned.

Subsequently, as shown in FIG. 4(b), bit lines 17' are formed to have an N-type impurity and a small junction depth.

Next, as shown in FIG. 4(c), an oxide film is buried between electrodes.

Further, as shown in FIG. 4(d), an insulating film 23 is formed and a second polysilicon layer 24" is deposited and patterned to form control gates.

Through these steps, the floating gates and the control gates are formed. Thereafter, according to an ordinary process, contact halls, aluminum electrodes and the like are formed to complete a non-volatile semiconductor memory.

FIGS. 5(a) and 5(b) show a plan view and a sectional view taken along a line A–A' of the related art non-volatile semiconductor memory, respectively. In device isolation regions (white square regions in FIG. 5(a)) located between the control gates 24 and between the bit lines 17', provided are impurity diffusion regions 27 (p+) of the same conductivity type as that of the substrate for improving a breakdown voltage between the bit lines 17'.

FIG. 6 shows a schematic equivalent circuit diagram of the above-described memory. Capacity 2 (Ctun) formed between the semiconductor substrate and the bit line via the oxide film around the floating gate 1 is coupled to capacity 4 (Cpp) formed between the floating gate 1 and the control gate 3 via the second insulating film.

The potential of the floating gate is controlled by capacitive coupling of the potentials of the control gate 3, the semiconductor substrate 5 and the bit lines 6a and 6b. Supposing the potential of the floating gate 1 is Vfg, that of the control gate 3 is Vcg and that of the bit lines 6a and 6b is the same as that of the semiconductor substrate 5, Vsub, for simplicity, the following equation holds:

$$Vfg = (Vcg - Vsub) \times Cpp / (Cpp + Ctun).$$

Defining Cpp/(Cpp+Ctun) as a gate capacitive coupling ratio Rcg (a so-called coupling ratio), the above equation is represented by Vfg=(Vcg−Vsub)×Rcg.

A capacitor which forms Cpp is composed of a lower electrode and an upper electrode. The lower electrode is the floating gate 1 separated by every bit line, and the upper electrode is the control gate 3 (a word line) separated by every bit line. Cpp is defined by the area obtained by multiplying a control gate width by the remainder of subtracting a separation width of the floating gate from the pitch of the bit lines, i.e., the area of a region where the floating gate contacts the control gate.

Ctun is defined by the area obtained by multiplying a gate length in a channel direction of the non-volatile semiconductor memory cell by a gate width in a direction perpendicular to the channel direction, i.e., the area of a region where the floating gate contacts the semiconductor substrate and the bit lines via the oxide film.

In a memory cell array (a contactless memory cell array) in which contacts for a plurality of non-volatile semiconductor memories are not positioned adjacently to the drains of the non-volatile semiconductor memories, the control gate width and a floating gate width are almost the same and restricted by the minimum photoetching dimension. For this reason, especially, the area of Ctun depends greatly upon the floating gate width in the channel direction of the non-volatile semiconductor memory cells, i.e., a channel length. That is, the smaller the floating gate width, the larger the gate capacitive coupling ratio Rcg, which means that the potential of the control gate can be controlled by applying a lower voltage and operating voltages can be reduced.

With progress of microfabrication of the non-volatile semiconductor memories, there is an increasing tendency to reduce the junction depth of the source or drain and the dimensions of an overlap of the floating gate with the source or drain.

However, since the bit line 17' of the above-explained non-volatile semiconductor memory cell is shared with the source or drain, where the junction depth of the source or drain is reduced, the resistance of the bit line increases, and therefore, readout speed and rewrite speed slow down.

Conversely, if a higher priority is given to the reduction of the resistance of the bit line, a diffusion profile becomes greater in depth and higher in concentration, and therefore, an overlap region of the bit line with the gate, that is, an ineffective region of the non-volatile semiconductor memory increases. Consequently, it becomes difficult to reduce the size of the non-volatile semiconductor memory.

Also, as shown in FIG. 5(a), in a junction region 26 between the bit line '17 (n+) and a device isolation diffusion region 27 (p+), the impurity concentration of the bit line 17' is raised for reducing the resistance of the bit line 17', a sharp junction is established, and therefore, the breakdown voltage between the bit line and the semiconductor substrate is deteriorated.

Further, if the bit line is deepened for reducing its resistance, an ineffective length of the bit line, i.e., the source and drain, increases. For this reason, assuming that a prefixed gate length is to be ensured, the gate length needs to be lengthened by the ineffective length. Consequently, the capacity between the semiconductor substrate and the floating gate increases, and the above-mentioned gate capacitive coupling ratio Rcg decreases.

The increase of the ineffective length increases the capacitive coupling between the bit line and the floating gate. As a result, when the potential of the bit line serving as a drain is raised at reading or at writing, the potential of the floating gate on an unselected word line and a selected bit line is raised by the capacitive coupling due to the raised potential, which causes the leakage between the bit lines to increase.

SUMMARY OF THE INVENTION

The present invention provides a first non-volatile semiconductor memory comprising at least one first gate electrode as a floating gate on a semiconductor substrate with intervention of a first insulating film as a tunnel oxide film; sidewall spacers on both sidewalls of the first gate electrode in a direction of a channel length; a bit line formed of an impurity diffusion region of a conductivity type different from the conductivity type of the semiconductor substrate in a surface layer of the semiconductor substrate by the side of the first gate electrode, wherein the bit line comprises a first bit line formed in self-alignment using the first gate electrode as a mask and a second bit line formed in self-alignment using the first gate electrode and the sidewall spacers as a mask.

The present invention further provides a first process of fabricating a non-volatile semiconductor memory comprising the steps of forming at least one first gate electrode as a floating gate on a semiconductor substrate with intervention of a first insulating film as a tunnel oxide film; implanting the semiconductor substrate with impurity ions of a conductivity type different from the conductivity type of the semiconductor substrate using the first gate electrode as a mask, thereby forming a first bit line in self-alignment; forming sidewall spacers on both sidewalls of the first gate electrode in a direction of a channel length; and implanting the semiconductor substrate with impurity ions of a conductivity type different from the conductivity type of the semiconductor substrate using the first gate electrode and the sidewall spacers as a mask, thereby forming a second bit line in self-alignment.

In another aspect, the present invention also provides a second non-volatile semiconductor memory comprising at least one first gate electrode as a floating gate on a semiconductor substrate with intervention of a first insulating film as a tunnel oxide film; sidewall spacers on both sidewalls of the first gate electrode in a direction of a channel length; and a bit line formed of an impurity diffusion region of a conductivity type different from the conductivity type of the semiconductor substrate in self-alignment in a surface layer of the semiconductor substrate using the first gate electrode and the sidewall spacers as a mask.

The present invention further provides a second process of fabricating a non-volatile semiconductor memory comprising the steps of forming at least one first gate electrode as a floating gate on a semiconductor substrate with intervention of a first insulating film as a tunnel oxide film; forming sidewall spacers on both sidewalls of the first gate electrode in a direction of a channel length; and implanting the semiconductor substrate with impurity ions of a conductivity type different from the conductivity type of the semiconductor substrate using the first gate electrode and the sidewall spacers as a mask, thereby forming a bit line in self-alignment.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Figure 1A:
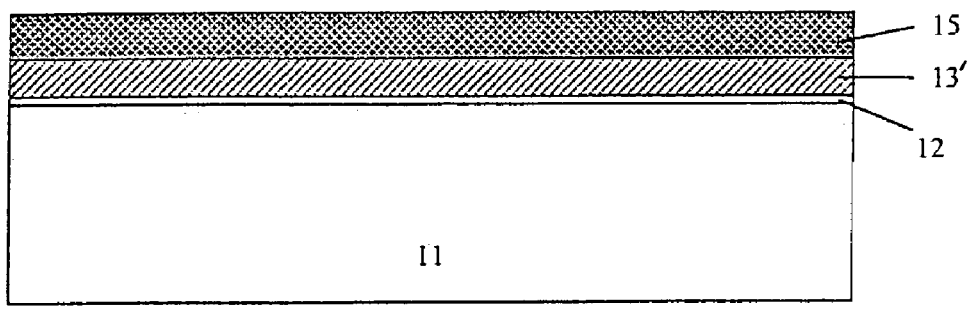
FIGS. 1(a) to 1(k) are schematic sectional views illustrating a process of fabricating a non-volatile semiconductor memory in accordance with Example 1 of the present invention.

According to the first non-volatile semiconductor memory of the present invention, the bit line can have a double structure, in which the diffusion profile of an overlap region where the impurity diffusion region functioning as a source or drain overlaps the gate electrode is dominated by the first bit line while the diffusion profile near the middle of the bit line is dominated by the second bit line.

The first non-volatile semiconductor memory is now described.

First, at least one first gate electrode as the floating gate is formed on the semiconductor substrate with intervention of the first insulating film as the tunnel oxide film.

The semiconductor substrate is not particularly limited to any type, but a silicon substrate, a silicon germanium substrate and the like may be used. The semiconductor substrate may be given a P- or N-type conductivity beforehand, and may be provided with a well of a P- or N-type conductivity.

The first insulating film may be formed of a silicon oxide film by thermal oxidation, CVD, sputtering or the like.

As the first gate electrode, may be used a film of a metal such as aluminum, copper or the like, a polysilicon film, a silicide film of silicon with a refractory metal such as titanium, tungsten or the like, a polycide film formed of a laminate of polysilicon and a silicide, and other films. The first gate electrode may be formed by a known method according to the type of its material.

The first insulating film and the first gate electrode are formed in a predetermined configuration by a known photolithography and etching method.

Subsequently, for operating the bit line and the semiconductor substrate at different potentials, the bit line is formed in self-alignment in the semiconductor substrate by implanting impurity ions of a conductivity type different from that of the semiconductor substrate using the first gate electrode as a mask. As the impurity ions, may be mentioned N-type impurity ions such as phosphorus ions, arsenic ions and the like and P-type impurity ions such as boron ions, $BF_2$ ions and the like.

Further, the sidewall spacers are formed on both sidewalls of the first gate electrode in the direction of the channel length. For the sidewall spacers, may be used a silicon oxide film, a silicon nitride film and a laminate thereof. The width of the sidewall spacers in the direction of the channel length may be set as appropriate depending upon desired performance of the non-volatile semiconductor memory.

The second bit line is formed in self-alignment by implanting impurity ions of a conductivity type different from that of the semiconductor substrate using the first gate electrode and the sidewall spacers as a mask. The dose, the injection energy of this implantation may be set as appropriate depending upon the desired performance of the non-volatile semiconductor memory. Preferably, the second bit line is formed deeper than the first bit line. By forming the second bit line deeper, the resistance of the second bit line can be reduced relative to that of the first bit line. The degree of the depth of the second bit line is such that the resistance of the second bit line is 10% lower than that of the first bit line. More particularly, if the first and the second bit lines are formed at the same dose, the second bit line is 10% or more deeper than the first bit line. For example, if the first bit line is 100 nm deep, the second bit line is 110 nm or more deep.

Here, a trench may be formed between the sidewall spacers. The trench may be formed in self-alignment using the gate electrode and the sidewall spacers as a mask, or may be formed by providing another mask. If the bit line is formed in the trench, the surface area of the bit line can be increased, and since the area of the second bit line is increased consequently, the resistance of the bit line can further be reduced.

Further, a second gate electrode as a control gate may be formed on the first gate electrode by a known method.

Next, according to the second non-volatile semiconductor memory of the present invention, unlike the first non-volatile semiconductor memory, only the second bit line forms the bit line without the first bit line. With this construction, the capacity between the semiconductor substrate and the first gate electrode and the capacity between the bit line and the first gate electrode can be reduced by replacing a part of the gate electrode conventionally positioned above the bit line with a sidewall spacer. As a result, the gate capacitive coupling ratio Rcg can be increased while the capacitive coupling between the bit line and the first gate electrode in an unselected cell.

Further, in the case where individual non-volatile semiconductor memories are separated from each other by impurity regions such as channel stop regions of the same conductivity type as that of the semiconductor substrate, since the channel stop regions are located at the same sites as injection ends of the bit lines, the PN junction breakdown voltage between the channel stop regions and the bit lines is decreased. In contrast, in the second non-volatile semiconductor memory, since the bit lines are formed using the sidewall spacers as a mask, an offset can be ensured between the channel stop regions and impurity injection windows for forming the bit lines. Accordingly, the PN junction breakdown voltage can be improved as compared with the related art memory. If the PN junction breakdown voltage is the same, the impurity concentration in the bit line can be increased, and thus, the resistance of the bit line can be reduced.

As described above, the construction of the second non-volatile semiconductor memory is the same as the construction of the first non-volatile semiconductor memory except that the first bit line is omitted in the second non-volatile semiconductor memory. Accordingly, all the materials and the fabrication process for the first non-volatile semiconductor memory are applicable to the second non-volatile semiconductor memory.

A plurality of the first and the second non-volatile semiconductor memories may be arranged in a matrix to form a memory cell array. In this case, the bit line is shared by two first gate electrodes adjacent to each other in the direction of the channel length. Also the bit line extends in a direction of a channel width and the control gate extends in a direction perpendicular to the bit line.

Data can be written in, read out of and erased from the non-volatile semiconductor memory of the present invention by known methods. For such operations, the non-volatile semiconductor memory can be operated at power consumption lower than the related art non-volatile semiconductor memory.

EXAMPLES

Example 1

An example of the process of fabricating a non-volatile semiconductor memory of the present invention is described with reference to FIGS. 1(a) to 1(k).

First, as shown in FIG. 1(a), an impurity is implanted into a semiconductor substrate 11 of a first conductivity type for adjusting the threshold voltage of a memory cell. Then, an oxide film (tunnel oxide film) 12 is formed to a thickness of about 8 to 12 nm on the resulting substrate by thermal oxidation. Thereafter a first polysilicon layer 13' (30 to 100 nm thick) and a silicon nitride film 15 (100 to 300 nm thick) are sequentially formed.

Figure 1B:
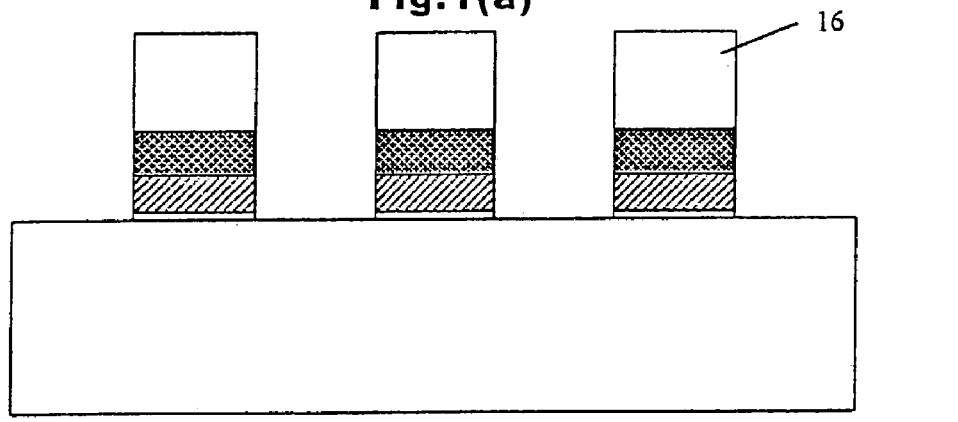

Next, as shown in FIG. 1(b), a resist film 16 is formed and patterned by lithography, the silicon nitride film 15/the first polysilicon film 13'/the oxide film 12 are etched away, and the resist film 16 is removed.

Figure 1C:
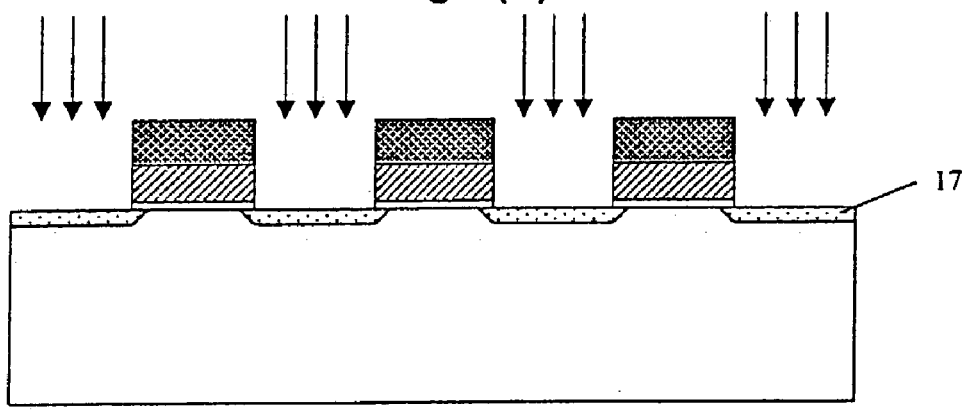

Subsequently, as shown in FIG. 1(c), As+ is implanted under the conditions of 10 to 20 keV and at 5E14 to 1E15 $cm^{-2}$ to form a first bit line 17 having a high impurity concentration and a small junction depth.

Figure 1D:
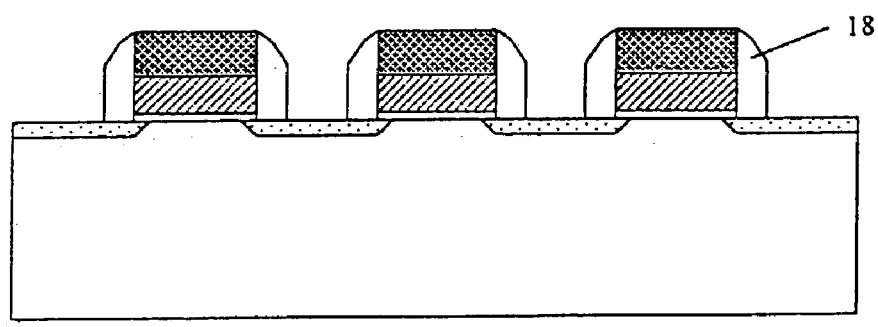

Next, as show in FIG. 1(d), an oxide film is deposited to about 50 to 100 nm thickness by CVD, and the oxide film is anisotropically etched to form a sidewall spacer 18.

Figure 1E:
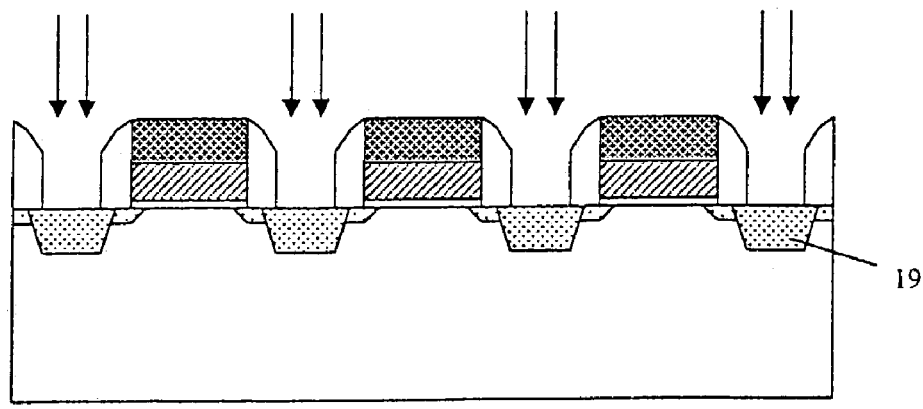

Further, as shown in FIG. 1(e), As+ is implanted under the conditions of 15 to 30 keV and 1E15 to 2E15 $cm^{-2}$ to form a second bit line 19 having a high impurity concentration and a large junction depth.

Figure 1F:
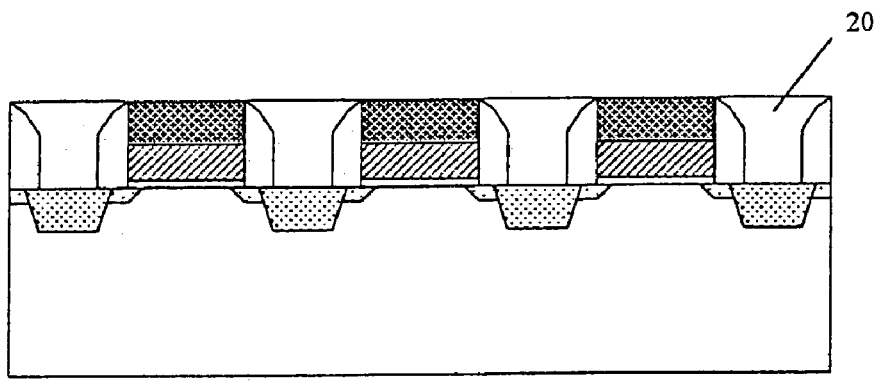

Subsequently, as shown in FIG. 1(f), an HDP oxide film 20 is deposited to about 300 to 500 nm thickness and flattened by CMP. Here, the silicon nitride film 15 serves as an etch stopper.

Figure 1G:
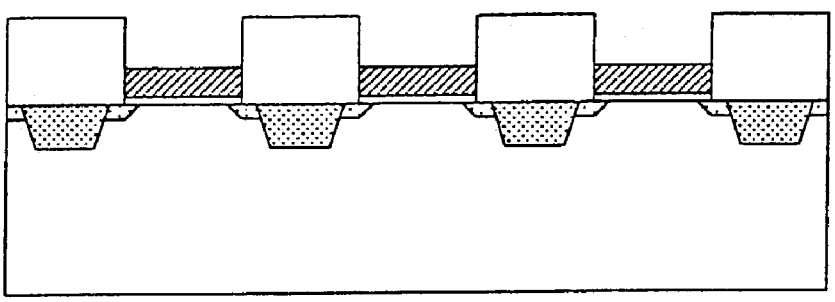

Next, as shown in FIG. 1(g), the silicon nitride film 15 is removed.

Figure 1H:
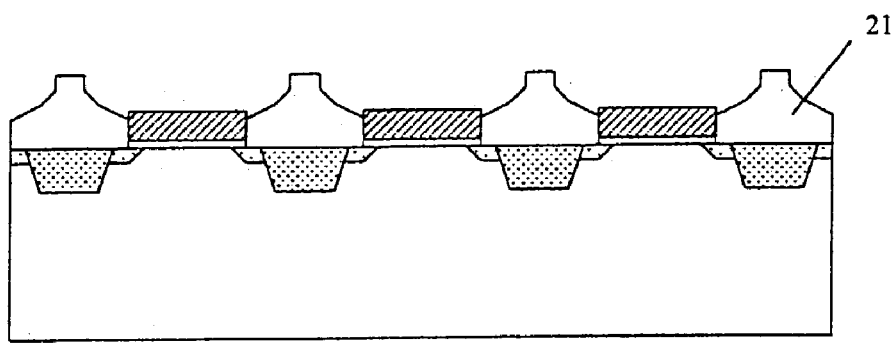

Thereafter, as shown in FIG. 1(h), the sidewall spacer 18 and the HDP oxide film 20 are removed by wet etching to produce a buried oxide film region 21.

Figure 1I:
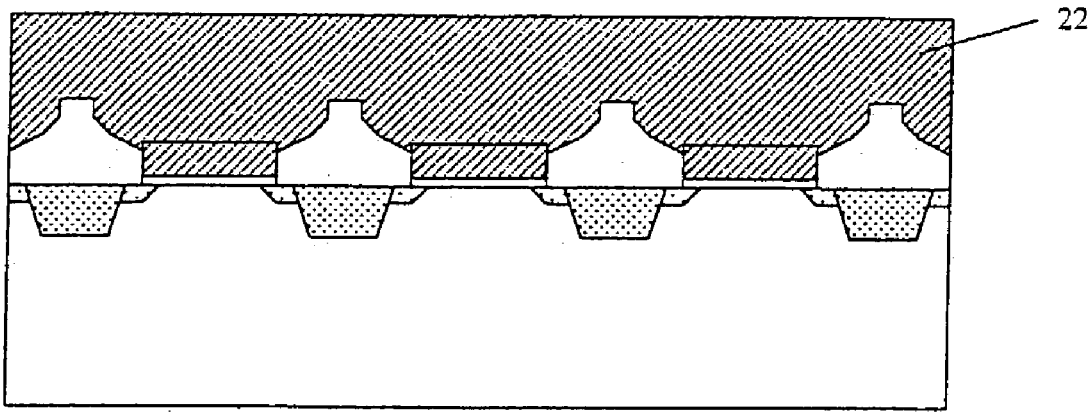

Subsequently, as shown in FIG. 1(i), a second polysilicon layer 22 is deposited to 50 to 300 nm thickness.

Figure 1J:
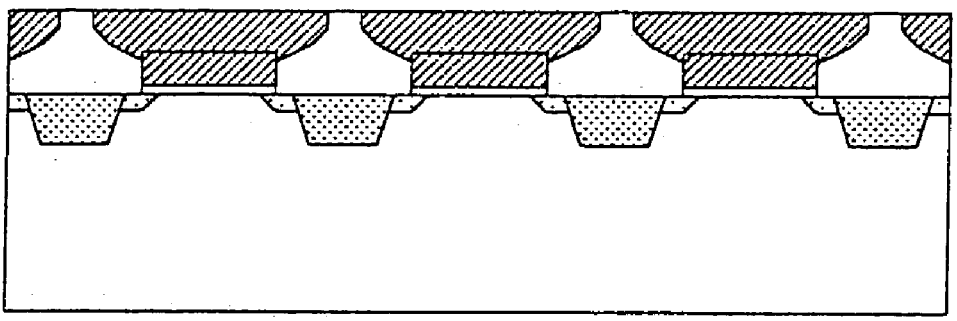

Further, as shown in FIG. 1(j), the second polysilicon layer 22 is flattened by CMP until the buried oxide film region 21 is exposed.

Figure 1K:
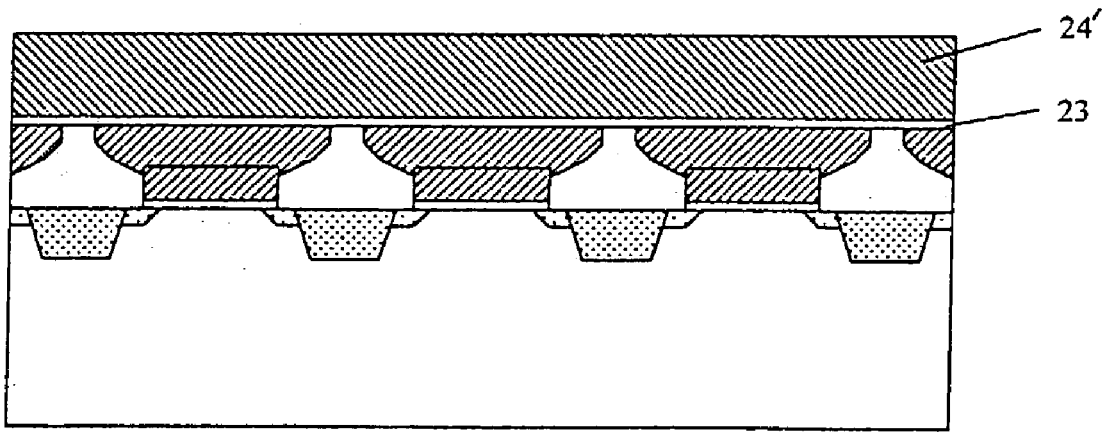

Next, as shown in FIG. 1(k), an insulating film 23 is formed of an ONO film of a silicon oxide film (4 to 5 nm thick), a silicon nitride film (5 to 10 nm thick) and a silicon oxide film (5 to 10 nm thick). Thereafter, a third polysilicon layer 24' is deposited to about 20 to 50 nm thickness. Then a resist film is formed and patterned by lithography. The third polysilicon layer 24'/the insulating film 23/the second polysilicon film 22/the first polysilicon layer 13' are etched away. Through these steps, a floating gate and a control gate are formed.

Subsequently, $BF_2$ is implanted under the conditions of 15 to 30 keV and 1E13 to 1E14 $cm^{-2}$ to form an impurity diffusion region for device isolation in a region between the control gates which region is also between the bit lines.

Finally, a BPSG (boron phosphorus silicon glass) protective film is deposited to about 1000 nm thickness.

Thereafter, according to an ordinary process, a contact hole, an aluminum electrode and the like are formed to provide the non-volatile semiconductor memory of Example 1.

The present invention is applicable not only to non-volatile memories with floating gates as described above but also all memories having diffusion wiring as bit lines.

Example 2

Another example of the process of fabricating a non-volatile semiconductor memory of the present invention is described with reference to FIGS. 2(a) to 2(l).

Figure 2A:
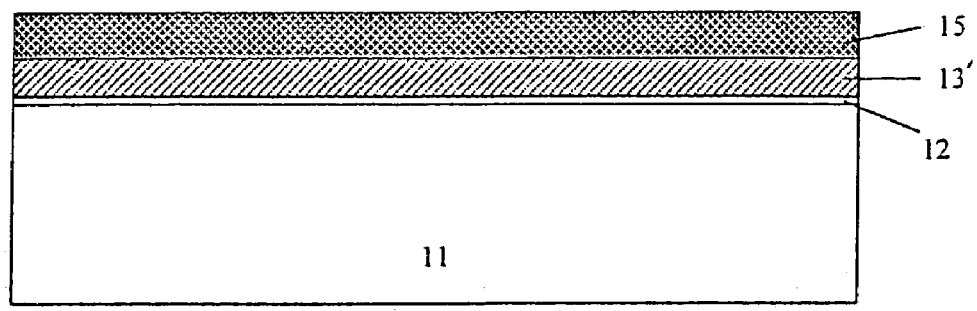
FIGS. 2(a) to 2(l) are schematic sectional views illustrating a process of fabricating a non-volatile semiconductor memory in accordance with Example 2 of the present invention.

First, as shown in FIG. 2(a), an impurity is implanted into a semiconductor substrate 11 of a first conductivity type for adjusting the threshold voltage of a memory cell. Then, an oxide film (tunnel oxide film) 12 is formed to about 8 to 12 nm thickness on the resulting substrate by thermal oxidation. Thereafter a first polysilicon layer 13' (30 to 100 nm thick) and a silicon nitride film 15 (100 to 300 nm thick) are sequentially formed.

Figure 2B:
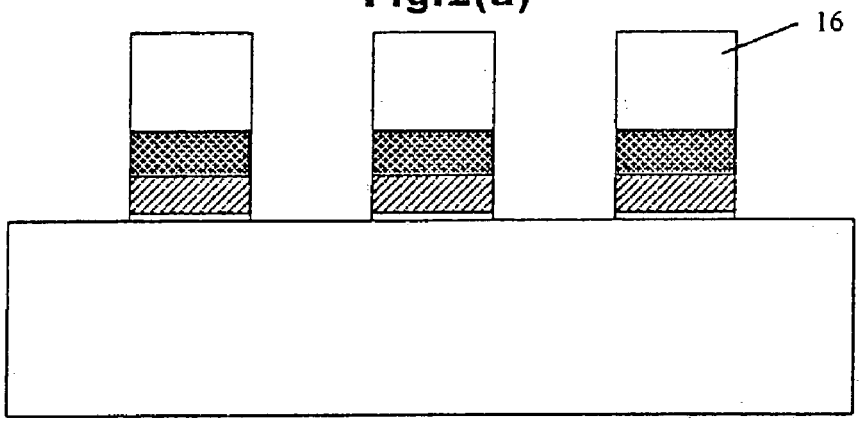

Next, as shown in FIG. 2(b), a resist film 16 is formed and patterned by lithography, the silicon nitride film 15/the first polysilicon film 13'/the oxide film 12 are etched away, and the resist film 16 is removed.

Figure 2C:
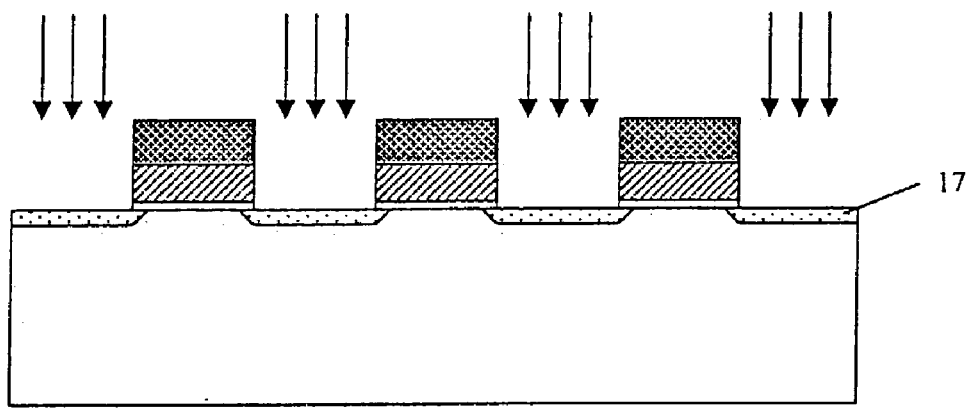

Subsequently, as shown in FIG. 2(c), As+ is implanted under the conditions of 10 to 20 keV and 5E14 to 1 E15 $cm^{-2}$ to form a first bit line 17 having a high impurity concentration and a small junction depth.

Figure 2D:
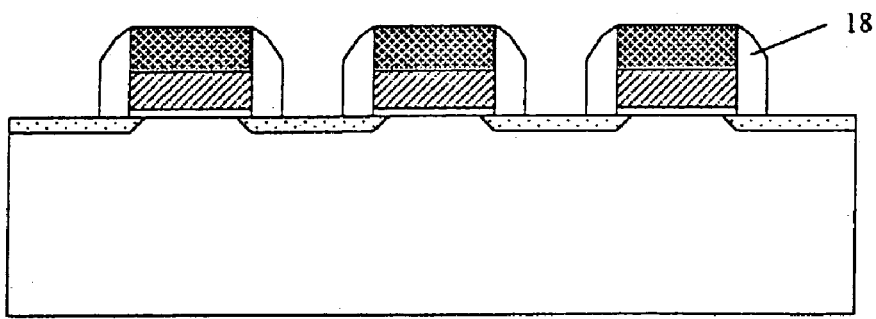

Further, as show in FIG. 2(d), an oxide film is deposited to about 50 to 100 nm thickness by CVD, and the oxide film is anisotropically etched to form a sidewall spacer 18.

Figure 2E:
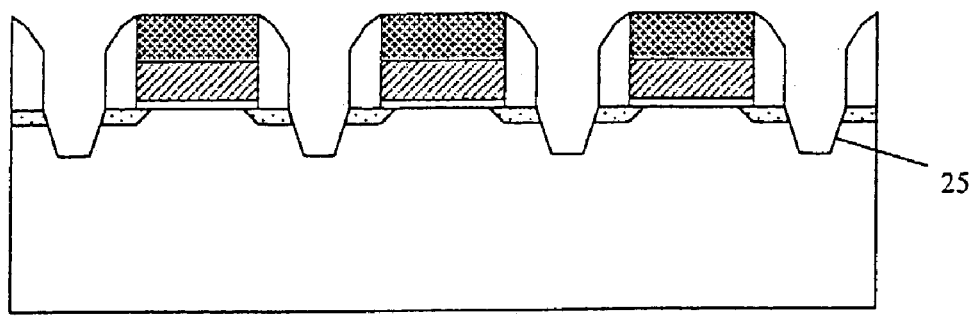

Next, as shown in FIG. 2(e), the semiconductor substrate 11 is etched to 50 to 250 nm depth using the silicon nitride film 15 and the sidewall spacer 18 as a mask to form a trench 25.

Figure 2F:
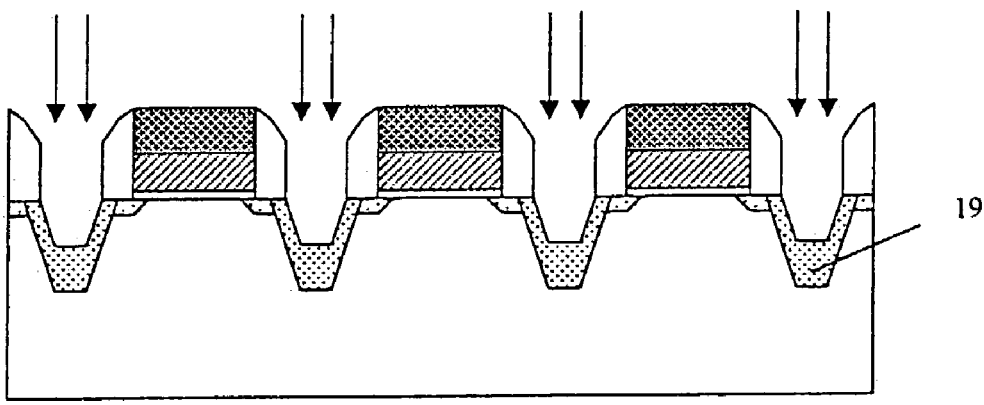

Subsequently, as shown in FIG. 2(f), As+ is implanted under the conditions of 15 to 30 keV and 1E15 to 2E15 $cm^{-2}$ to form a second bit line 19 having a high impurity concentration and a large junction depth.

Figure 2G:
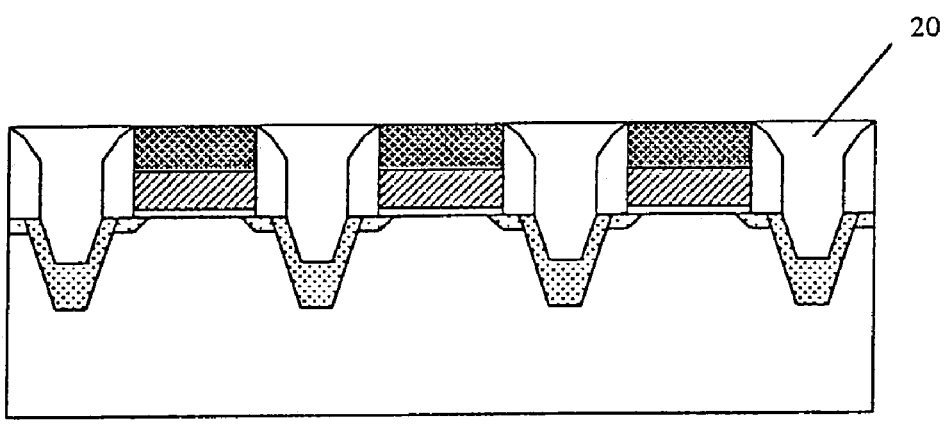

Further, as shown in FIG. 2(g), an HDP oxide film 20 is deposited to about 300 to 500 nm thickness and flattened by CMP. Here, the silicon nitride film 15 serves as an etch stopper.

Figure 2H:
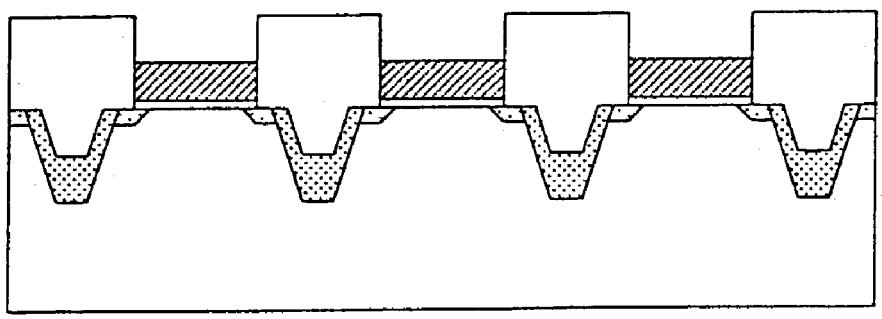

Next, as shown in FIG. 2(h), the silicon nitride film 15 is removed.

Figure 2I:
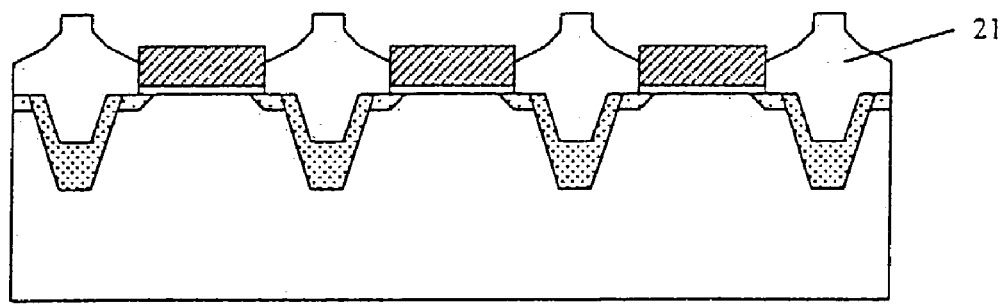

Subsequently, as shown in FIG. 2(i), the sidewall spacer 18 and the HDP oxide film 20 are removed by wet etching to produce a buried oxide film region 21.

Figure 2J:
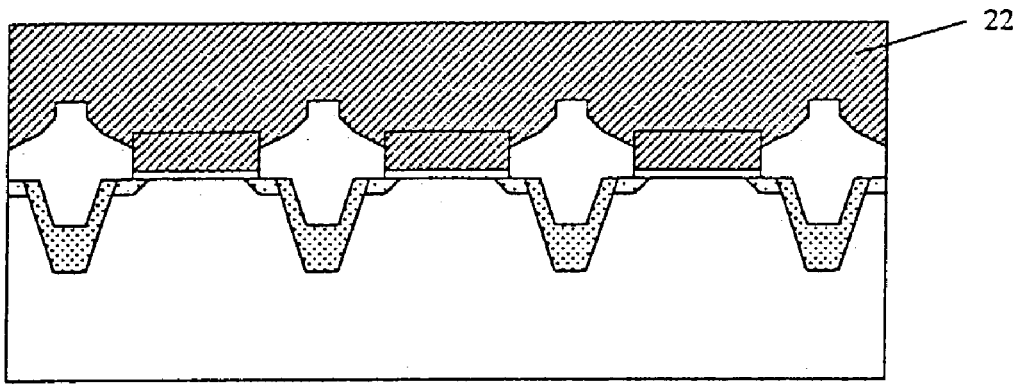

Further, as shown in FIG. 2(j), a second polysilicon layer 22 is deposited to 50 to 300 nm thickness.

Figure 2K:
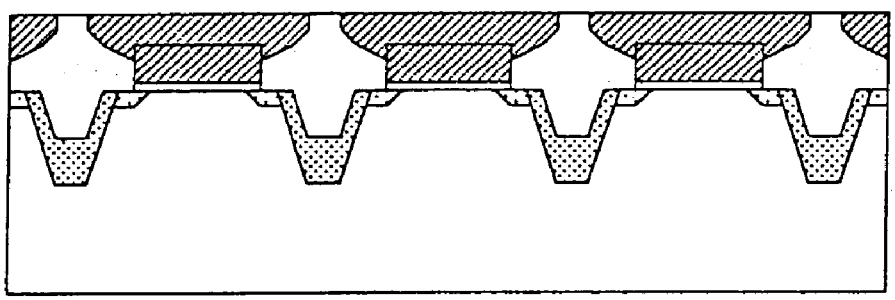

Next, as shown in FIG. 2(k), the second polysilicon layer 22 is flattened by CMP until the buried oxide film region 21 is exposed.

Figure 2L:
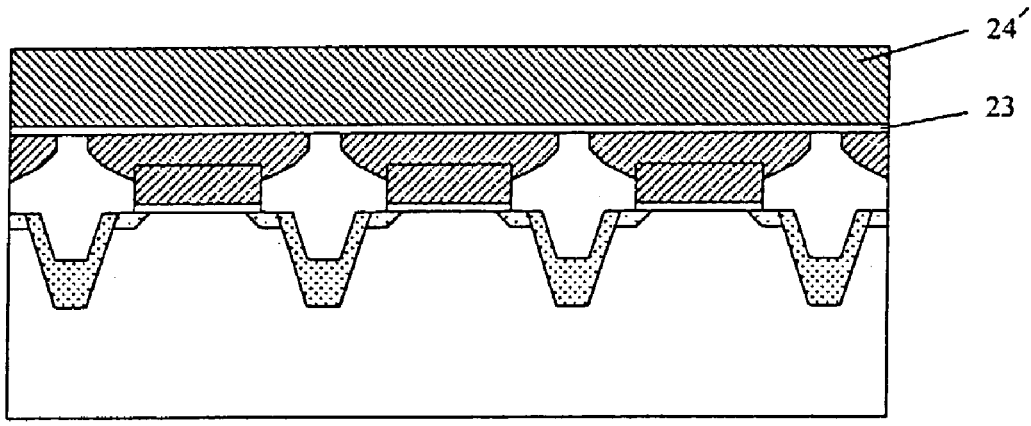

Thereafter, as shown in FIG. 2(l), an insulating film 23 is formed of an ONO film of a silicon oxide film (4 to 5 nm thick), a silicon nitride film (5 to 10 nm thick) and a silicon oxide film (5 to 10 nm thick). Thereafter, a third polysilicon layer 24' is deposited to about 20 to 50 nm thickness. Then a resist film is formed and patterned by lithography. The third polysilicon layer 24'/the insulating film 23/the second polysilicon film 22/the first polysilicon layer 13' are etched away. Through these steps, a floating gate and a control gate are formed.

Further, $BF_2$ is implanted under the conditions of 15 to 30 keV and 1E13 to 1E14 $cm^{-2}$ to form an impurity diffusion region for device isolation in a region between the control gates which region is also between the bit lines.

Finally, a BPSG protective film is deposited to about 1000 nm thickness.

Thereafter, according to an ordinary process, a contact hole, an aluminum electrode and the like are formed to provide the non-volatile semiconductor memory of Example 2.

The present invention is applicable not only to non-volatile memories with floating gates as described above but also all memories having diffusion wiring as bit lines.

Example 3

Still another example of the process of fabricating a non-volatile semiconductor memory of the present invention is described with reference to FIGS. 3(a) to 3(k).

Figure 3A:
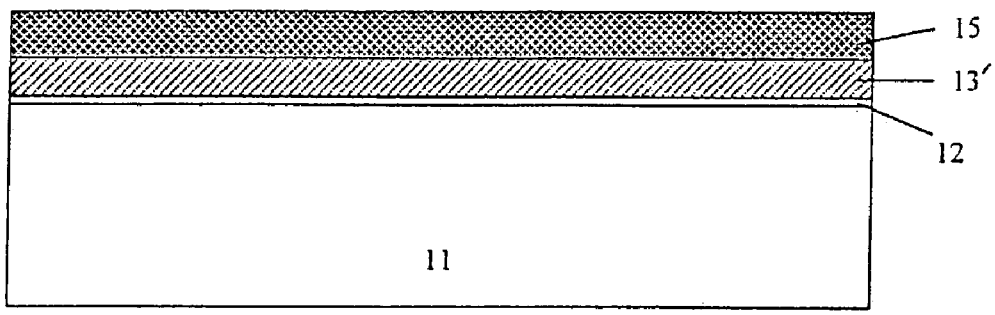
FIGS. 3(a) to 3(k) are schematic sectional views illustrating a process of fabricating a non-volatile semiconductor memory in accordance with Example 3 of the present invention.

First, as shown in FIG. 3(a), an impurity is implanted into a semiconductor substrate 11 of a first conductivity type for adjusting the threshold voltage of a memory cell. Then, an oxide film (tunnel oxide film) 12 is formed to a thickness of about 8 to 12 nm on the resulting substrate by thermal oxidation. Thereafter a first polysilicon layer 13' (30 to 100 nm thick) and a silicon nitride film 15 (100 to 300 nm thick) are sequentially formed.

Figure 3B:
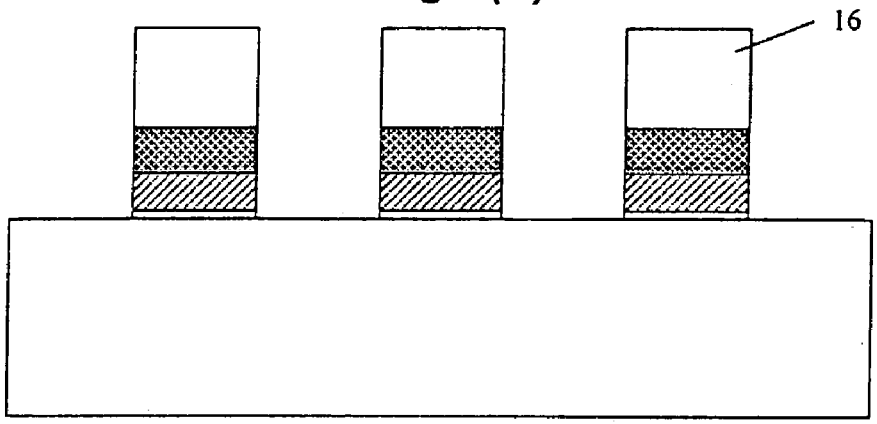

Next, as shown in FIG. 3(b), a resist film 16 is formed and patterned by lithography, the silicon nitride film 15/the first polysilicon film 13'/the oxide film 12 are etched away, and the resist film 16 is removed.

Figure 3C:
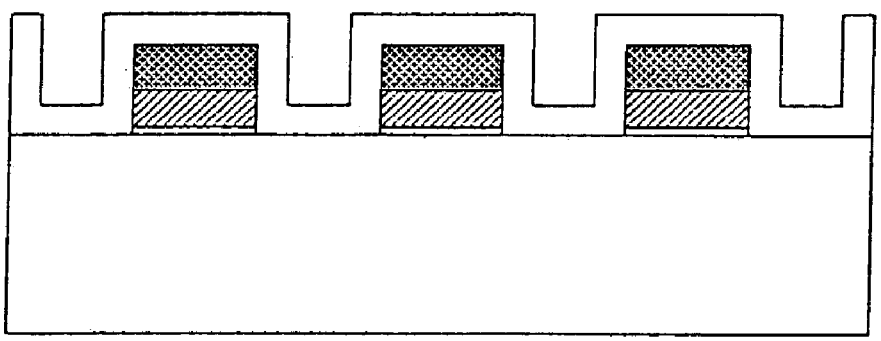
Figure 3D:
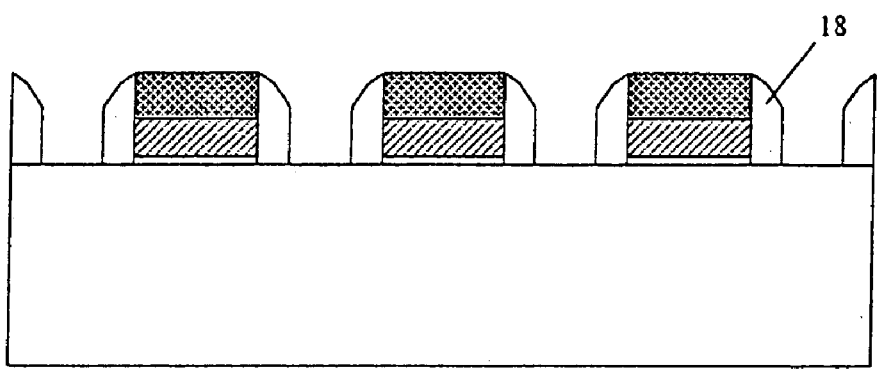

Subsequently, as shown in FIGS. 3(c) and 3(d), an oxide film is deposited to about 50 to 100 nm thickness by CVD, and the oxide film is anisotropically etched to form a sidewall spacer 18.

Figure 3E:
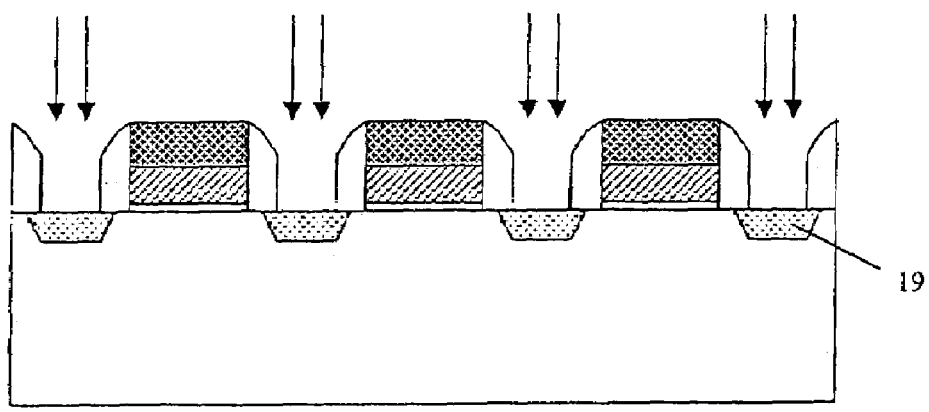

Further, as shown in FIG. 3(e), As+ is implanted under the conditions of 15 to 30 keV and 1E14 to 2E15 $cm^{-2}$ to form a second bit line 19 having a high impurity concentration and a large junction depth.

Figure 3F:
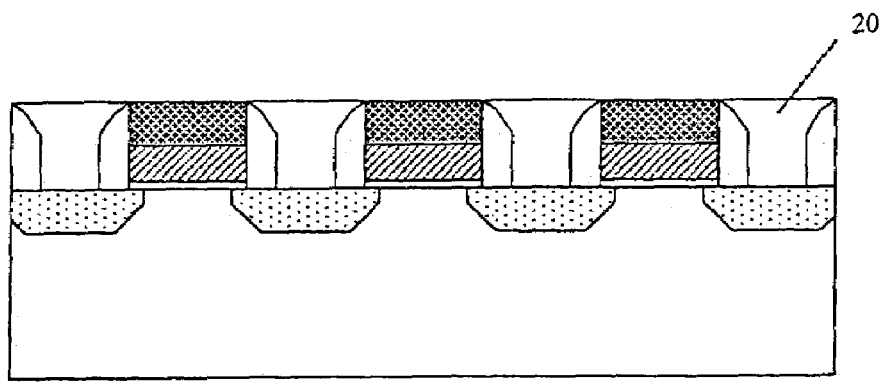

Next, as show in FIG. 3(f), an HDP oxide film 20 is deposited to about 300 to 500 nm thickness and flattened by CMP. Here, the silicon nitride film 15 serves as an etch stopper.

Figure 3G:
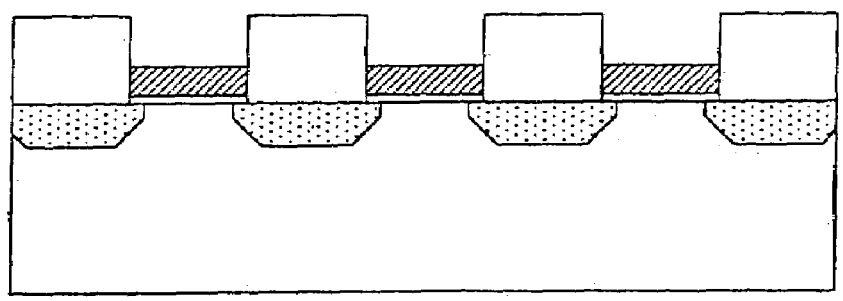

Next, as shown in FIG. 3(g), the silicon nitride film 15 is removed.

Figure 3H:
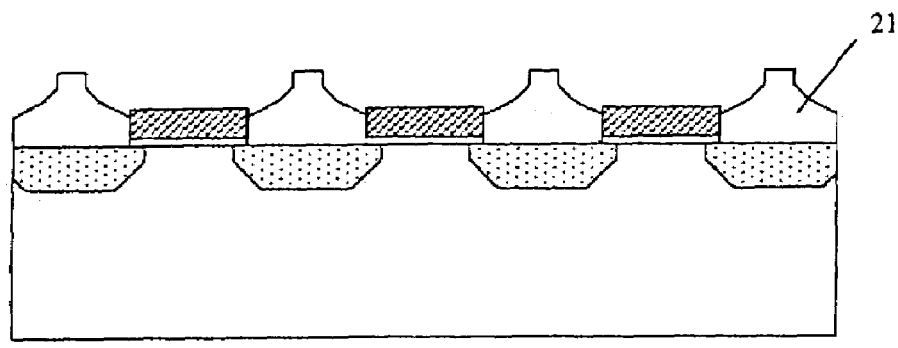

Further, as shown in FIG. 3(h), the sidewall spacer 18 and the HDP oxide film 20 are removed by wet etching to produce a buried oxide film region 21.

Figure 3I:
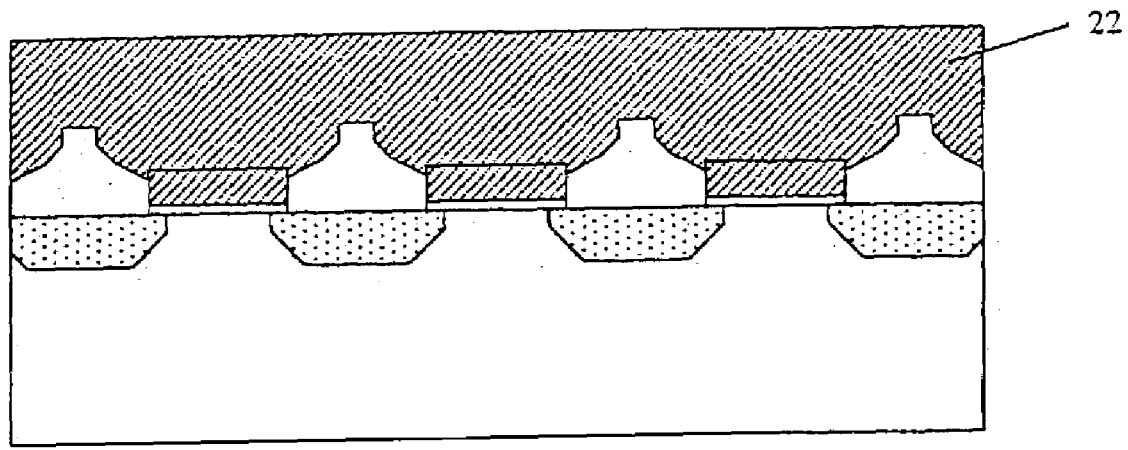

Next, as shown in FIG. 3(i), a second polysilicon layer 22 is deposited to 50 to 300 nm thickness.

Figure 3J:
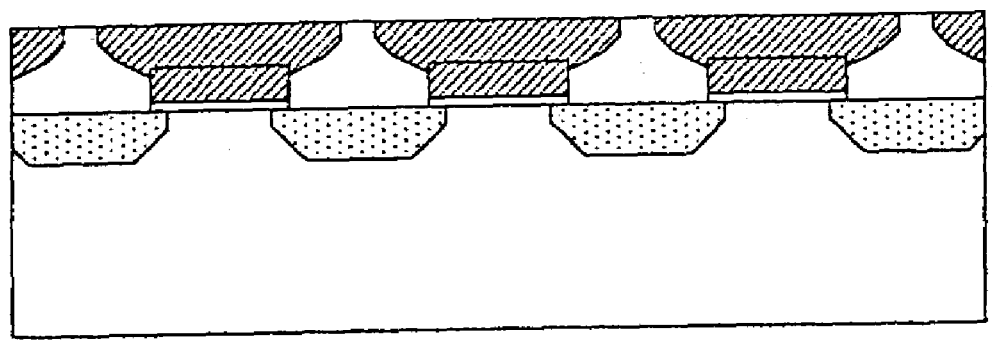

Subsequently, as shown in FIG. 3(j), the second polysilicon layer 22 is flattened by CMP until the buried oxide film region 21 is exposed.

Figure 3K:
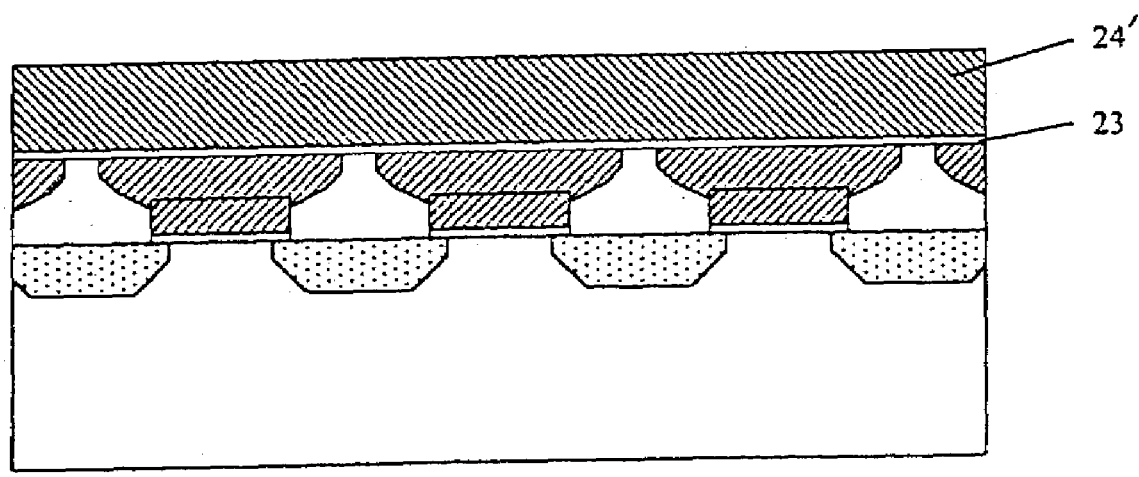
Figure 4A:
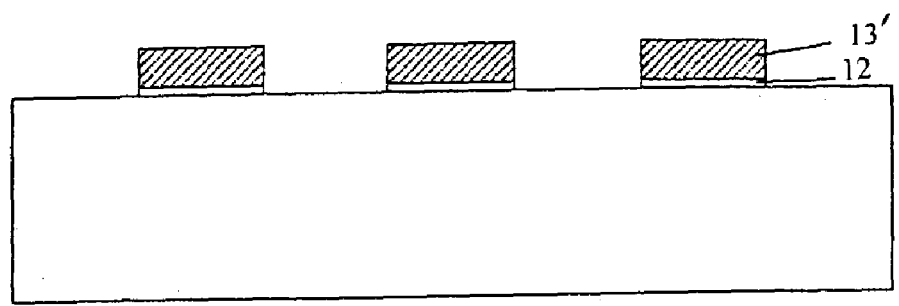
FIGS. 4(a) to 4(d) are schematic sectional views illustrating a process of fabricating a non-volatile semiconductor memory of the prior art.
Figure 4B:
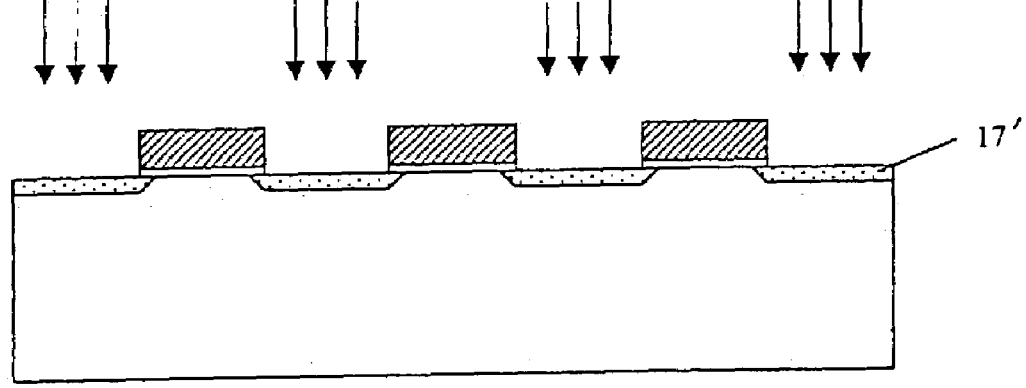
Figure 4C:
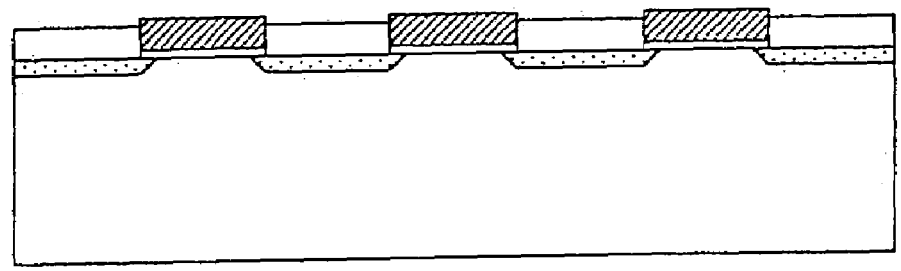
Figure 4D:
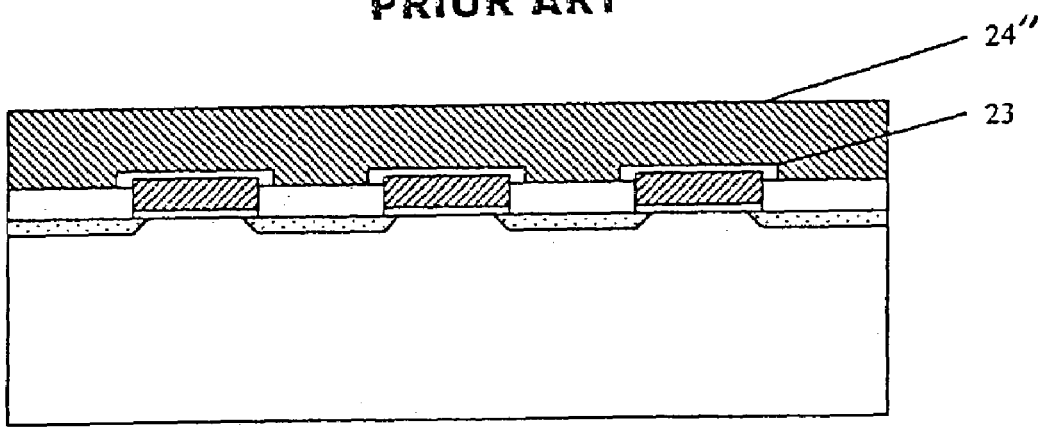
Figure 5A:
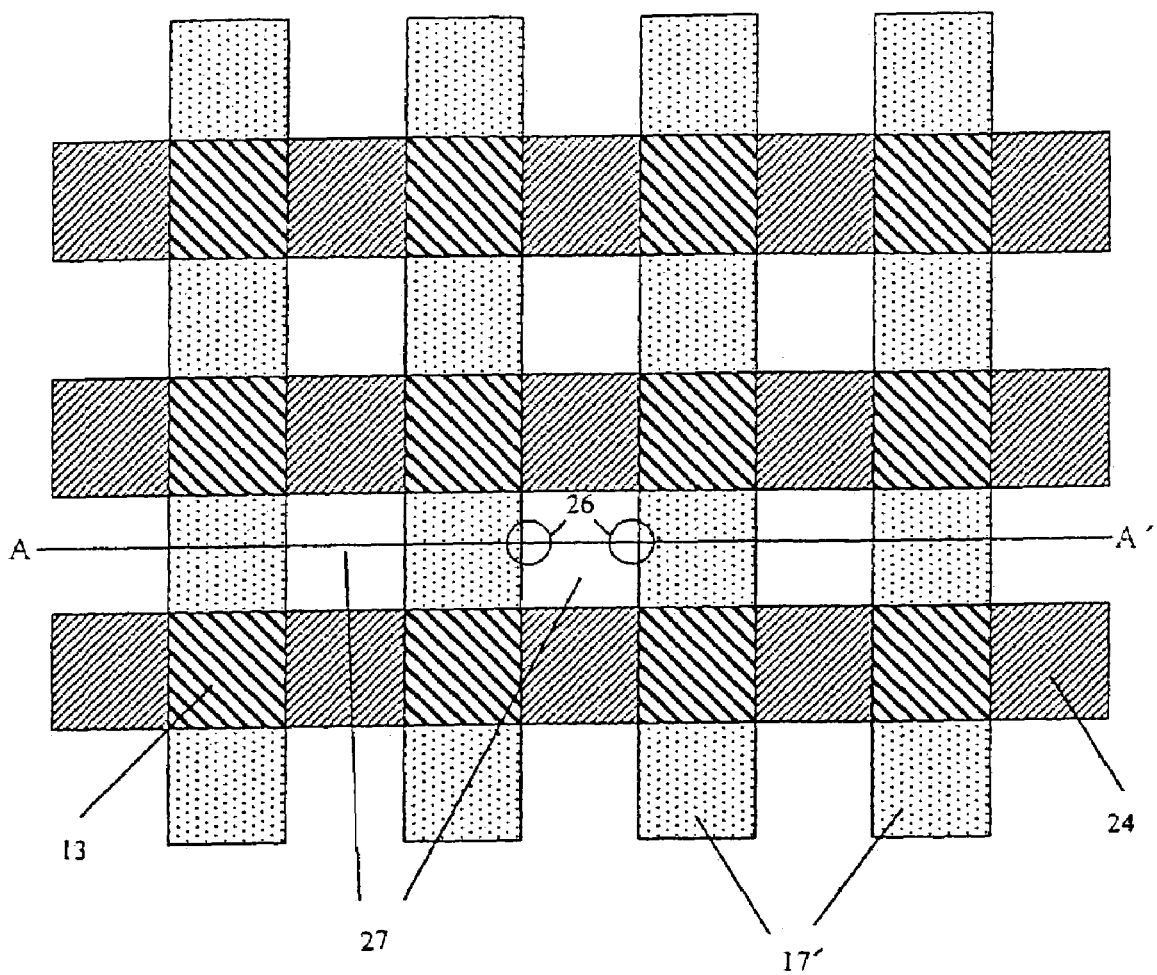
FIGS. 5(a) and 5(b) are a schematic plan view and a schematic sectional view of a non-volatile semiconductor memory of the prior art.
Figure 5B:
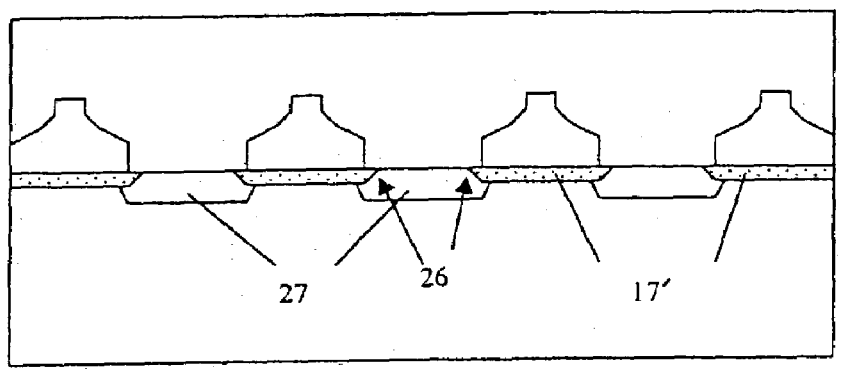
Figure 6:
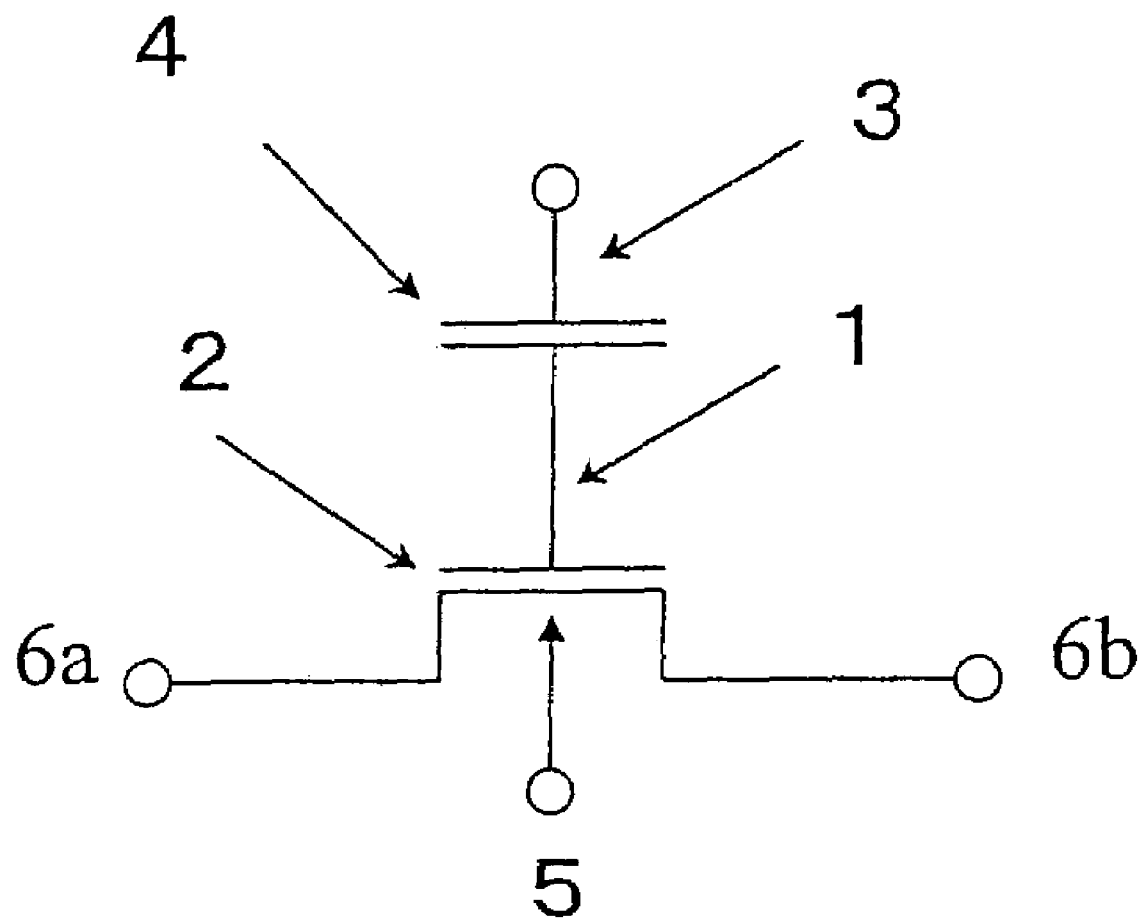
FIG. 6 is an equivalent circuit diagram of a non-volatile semiconductor memory.

Next, as shown in FIG. 3(k), an insulating film 23 is formed of an ONO film of a silicon oxide film (4 to 5 nm thick), a silicon nitride film (5 to 10 nm thick) and a silicon oxide film (5 to 10 nm thick). Thereafter, a third polysilicon layer 24' is deposited to about 20 to 50 nm thickness. Then a resist film is formed and patterned by lithography. The third polysilicon layer 24'/the insulating film 23/the second polysilicon film 22/the first polysilicon layer 13' are etched away.

Through these steps, a floating gate and a control gate are formed.

Subsequently, $BF_2$ is implanted under the conditions of 15 to 30 keV and 1E13 to 1E14 $cm^{-2}$ to form an impurity diffusion region for device isolation in a region between the control gates which region is also between the bit lines.

Finally, a BPSG protective film is deposited to about 1000 nm thickness.

Thereafter, according to an ordinary process, a contact hole, an aluminum electrode and the like are formed to provide the non-volatile semiconductor memory of Example 3.

The present invention is applicable not only to non-volatile memories with floating gates as described above but also all memories having diffusion wiring as bit lines.

Evaluation

Figure 7:
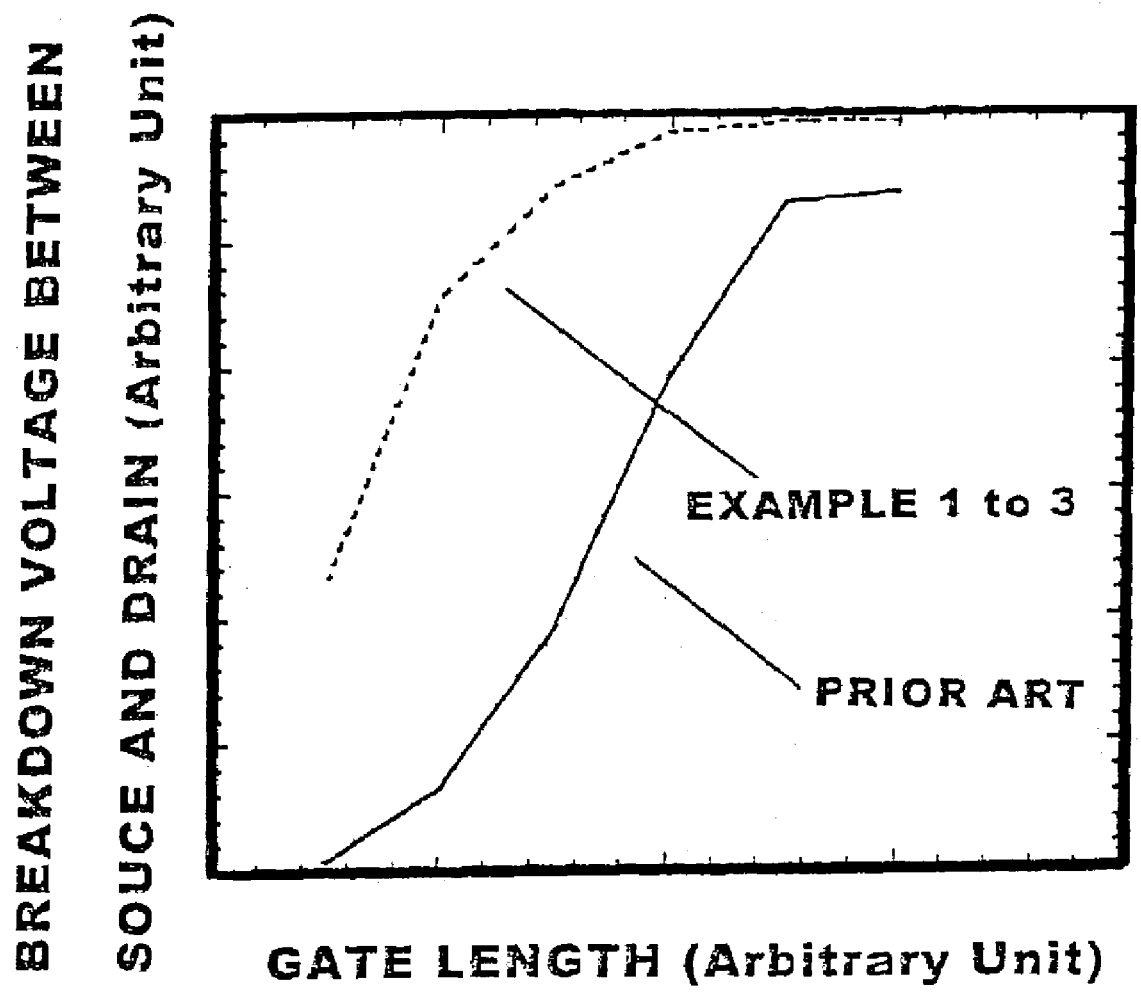
FIG. 7 is a graphical representation showing a relationship of the gate length to the breakdown voltage between a source and a drain in a non-volatile semiconductor memory.

FIG. 7 is a graphical representation showing a relationship of the gate length to the breakdown voltage between the source and the drain in the non-volatile semiconductor memories of Examples 1 to 3 of the present invention and the related art non-volatile semiconductor memory shown in FIGS. 4(a) to 4(d). FIG. 7 shows that, as compared with the related art memory, the memories of the present invention can improve the breakdown voltage between the source and the drain where their gate lengths are the same as the related art gate length and that the gate length can be shortened in the memories of the present invention where their breakdown voltage is the same as the related art breakdown voltage.

Figure 8:
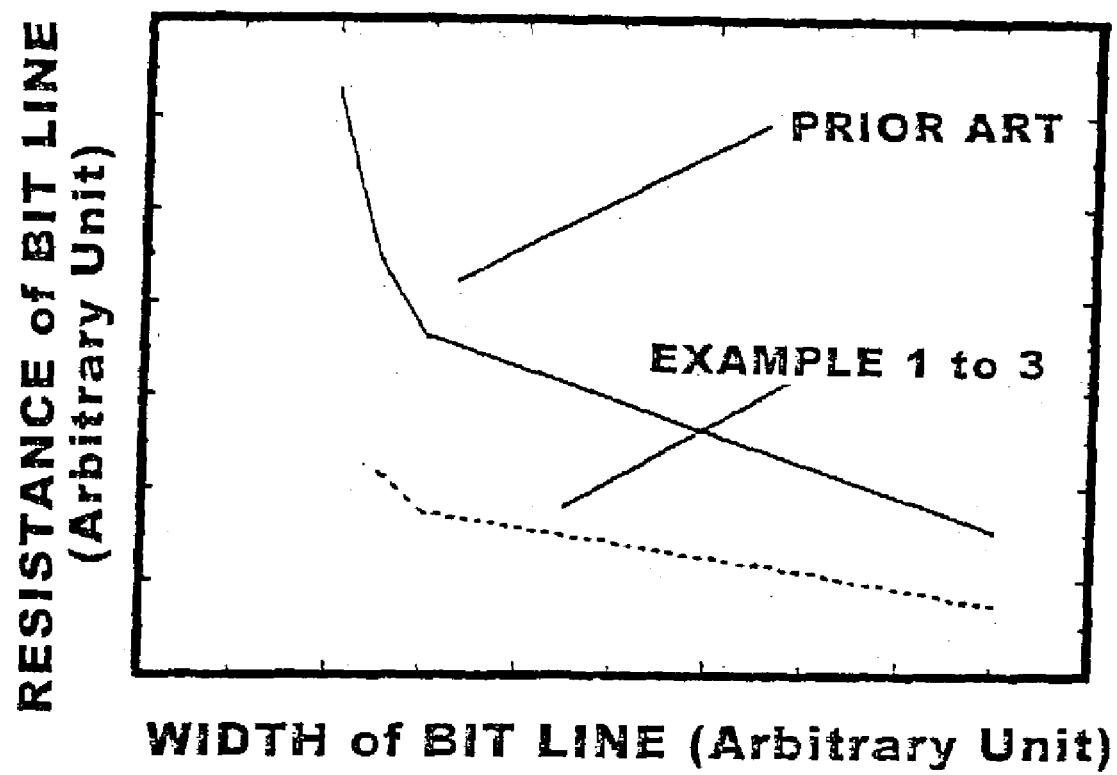
FIG. 8 is a graphical representation showing a relationship of the width of a bit line to the resistance of a bit line in a non-volatile semiconductor memory.

FIG. 8 is a graphical representation showing a relationship of the width of the bit line to the resistance of the bit line in the non-volatile semiconductor memories of Examples 1 to 3 of the present invention and the related art memory shown in FIG. 4(a) to 4(d). FIG. 8 shows that, as compared with the related art memory, the memories of the present invention can reduce the resistance of the bit line where their bit line width is the same as the related art bit line width and that the bit line width can be shortened in the memories of the present invention where their bit line width is the same as the related art bit line width.

Therefore, the non-volatile semiconductor memories of the present invention as shown in Examples 1 to 3 allow further reduction in their size and in the resistance as compared with the related art non-volatile semiconductor memory.

Operation Method

An example of operating the non-volatile semiconductor memories of the present invention as shown in Examples 1 to 3 is now described. The following example, however, is not to limit the operation method of the present invention, which can be modified in various ways.

Table 1 shows a set of voltages applied to major terminals of non-volatile semiconductor memories for reading, writing and erasing data, for example. In Table 1, in a memory cell array including a plurality of bit lines and a plurality of word lines (control gates), a memory located at an intersection of n-th and (n+1)-th bit lines with an m-th word line is selectively operated.

TABLE 1

| Operation | Bit Line BLn (Drain) | Bit Line BLn + 1 (Source) | Word Line WLm | Word Line WLm + 1 | Semiconductor Substrate |
|---|---|---|---|---|---|
| Reading | 1 V | 0 V | 4 V | 0 V | 0 V |
| Writing | 6 V | 0 V | 12 V | 0 V | 0 V |
| Erasing | 8 V | 8 V | −8 V | −8 V | 8 V |

The reading operation is performed by obtaining a reading current depending only upon data corresponding to an electron amount stored at the floating gate of the selected non-volatile semiconductor memory under the conditions of Table 1.

The writing operation is performed by allowing a writing current to flow only through the selected non-volatile semiconductor memory under the conditions of Table 1 and injecting hot electrons into the floating gate by the current.

The erasing operation is performed by applying voltages shown in Table 1 to all the bit lines and the word lines and thereby taking electrons from floating gates to the substrate or the bit lines utilizing a tunneling phenomenon of the tunnel oxide film.

By adopting the above-described structure and fabrication process, it is possible to realize the reduction of the resistance of the bit line and the reduction of the size of the memory, which are in trade-off relation, by optimization using different parameters, such as, the reduction of the size of the memory by optimizing the conditions for forming the first bit line and the reduction of the resistance of the bit line by optimizing the conditions for forming the second bit line.

Further, it is possible to reduce the resistance of the bit line while suppressing the deterioration of the breakdown voltage between the bit line and the substrate by optimizing the conditions for forming the first and second bit lines.

Also, as shown in Example 2, by forming the trench in the semiconductor substrate, it is possible to increase the surface area of the bit line and the area of the second bit line containing the impurity in a high concentration and thereby reduce the resistance of the bit line further.

Furthermore, by forming only the second bit line without forming the first bit line and thus replacing a part of the floating gate, which is conventionally located above the diffusion region, with the spacer, it is possible to reduce the capacity between the substrate and the floating gate and the capacity between the bit line and the floating gate and thereby reducing the gate capacitive coupling ratio Rcg and also the capacitive coupling between the bit line and the floating gate of a non-selected cell. Consequently, the gate voltage at writing can be reduced and also the leakage current between the bit lines can be reduced. Thus it is possible to reduce the power consumption at writing and at reading.

What is claimed is:

1. A non-volatile semiconductor memory comprising:
   at least one first gate electrode as a floating gate on a semiconductor substrate with intervention of a first insulating film as a tunnel oxide film;
   sidewall spacers on both sidewalls of the first gate electrode in a direction of a channel length;
   a bit line formed of an impurity diffusion region of a conductivity type different from the conductivity type of the semiconductor substrate in a surface layer of the semiconductor substrate by the side of the first gate electrode,
   wherein the bit line comprises a first bit line formed in self-alignment using the first gate electrode as a mask and a second bit line formed in self-alignment using the first gate electrode and the sidewall spacers as a mask; and
   wherein the second bit line has a higher impurity concentration than the first bit line.

2. A non-volatile semiconductor memory comprising:
   at least one first gate electrode as a floating gate on a semiconductor substrate with intervention of a first insulating film as a tunnel oxide film;
   sidewall spacers on both sidewalls of the first gate electrode in a direction of a channel length;
   a bit line formed of an impurity diffusion region of a conductivity type different from the conductivity type of the semiconductor substrate in a surface layer of the semiconductor substrate by the side of the first gate electrode,
   wherein the bit line comprises a first bit line formed in self-alignment using the first gate electrode as a mask and a second bit line formed in self-alignment using the first gate electrode and the sidewall spacers as a mask; and
   wherein the semiconductor substrate is provided with a trench in a region adjacent to the sidewall spacer, and the second bit line is formed in a surface layer of the trench.

3. A non-volatile semiconductor memory according to claim 2, wherein the trench is formed in self-alignment using the first gate electrode and the side wall spacers as a mask.

4. A non-volatile semiconductor memory comprising:
   at least one first gate electrode as a floating gate on a semiconductor substrate with intervention of a first insulating film as a tunnel oxide film;
   sidewall spacers on both sidewalls of the first gate electrode in a direction of a channel length;
   a bit line formed of an impurity diffusion region of a conductivity type different from the conductivity type of the semiconductor substrate in a surface layer of the semiconductor substrate by the side of the first gate electrode,
   wherein the bit line comprises a first bit line formed in self-alignment using the first gate electrode as a mask and a second bit line formed in self-alignment using the first gate electrode and the sidewall spacers as a mask; and
   wherein the second bit line is deeper than the first bit line.

* * * * *